(12) United States Patent
Kim et al.

(10) Patent No.: US 8,226,808 B2
(45) Date of Patent: Jul. 24, 2012

(54) METHOD FOR MANUFACTURING METAL ELECTRODE HAVING TRANSITION METALLIC COATING LAYER AND METAL ELECTRODE MANUFACTURED THEREBY

(75) Inventors: Hak-Kwan Kim, Hanam-si (KR); Seung-Hyun Ra, Seongnam-si (KR); Jun-Hee Bae, Suwon-si (KR); Hyun-Chul Jung, Yongin-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 329 days.

(21) Appl. No.: 12/511,806

(22) Filed: Jul. 29, 2009

(65) Prior Publication Data

US 2010/0233496 A1    Sep. 16, 2010

(30) Foreign Application Priority Data

Mar. 10, 2009   (KR) .................. 10-2009-0020314

(51) Int. Cl.
*C25D 5/02*  (2006.01)
*B05D 1/18*  (2006.01)

(52) U.S. Cl. .............. 205/118; 205/191; 427/430.1
(58) Field of Classification Search .......... 205/118, 205/191; 427/430.1, 436
See application file for complete search history.

(56) References Cited

U.S. PATENT DOCUMENTS

| | | | |
|---|---|---|---|
| 6,063,142 A * | 5/2000 | Kawakami et al. | 29/623.5 |
| 2005/0142385 A1* | 6/2005 | Jin | 428/694 T |
| 2008/0218939 A1* | 9/2008 | Marcus et al. | 361/505 |

FOREIGN PATENT DOCUMENTS

KR   10-2005-0068398   7/2005

\* cited by examiner

*Primary Examiner* — Luan Van
(74) *Attorney, Agent, or Firm* — McDermott Will & Emery LLP

(57) ABSTRACT

It is to provide a method for manufacturing a metal electrode having transition metal oxide coating layer and a metal electrode manufactured thereby, which eliminates a contact resistance problem and simultaneously improves electric conductivity of the electrode by using a one body electrode, which is not requiring separate current collector and binder, and further maintains pseudo-capacitance from the redox reaction by coating the metal surface with a transition metal oxide.

5 Claims, 2 Drawing Sheets

METHOD FOR MANUFACTURING METAL ELECTRODE HAVING TRANSITION METALLIC COATING LAYER AND METAL ELECTRODE MANUFACTURED THEREBY

CROSS-REFERENCE TO RELATED APPLICATIONS

This application claims the benefit of Korean Patent Application No. 10-2009-0020314 filed with the Korean Intellectual Property Office on Mar. 10, 2009, the disclosure of which is incorporated herein by reference in its entirety.

BACKGROUND

1. Technical Field

It relates to a method for manufacturing a metal electrode having a transition metal oxide coating layer and a metal electrode manufactured thereby.

2. Description of the Related Art

Higher value-added businesses which collect and use various and useful information in real time by employing IT equipments receive attentions and stable energy supply for securing reliability of such systems becomes an important factor in the information-oriented society. These IT equipments and electrical devices include electric circuit boards and each circuit board has a capacitor which stores an electric charge and releases it when required and thus stabilizes energy flow in the circuit. This capacitor has a very short charge/discharge time, a long lifetime and a high power density but generally a very low energy density. This disadvantage of low energy density causes many limitations on its use as an energy storage device.

However, electrochemical capacitors, supercapacitors or ultracapacitors, which have started to be commercialized in Japan, Russia, USA, etc. since 1995, are under development in all countries of the world to provide higher energy density as next generation energy storage devices along with secondary batteries.

A supercapacitor can be broadly classified into 3 categories depending on the electrode and the mechanism: (1) an electric double layer capacitor (EDLC) which employs activated carbon as an electrode and is based on an electric double layer electric charge absorption mechanism; (2) a metal oxide electrode pseudocapacitor (or redox capacitor) which employs a transition metal oxide and a conductive polymer as an electrode material and is based on a pseudo-capacitance mechanism; and (3) a hybrid capacitor which combines the features of both electrochemical and electrolytic capacitors. Among them, the EDLC-type supercapacitor using activated carbons is currently used the most.

The supercapacitor is composed of an electrode, an electrolyte, a current collector, and a separator and is based on the electrochemical mechanism which stores energy through absorption of electrolyte ions on the electrode surface by migrating along with the electric field when voltages are applied on the both ends of a unit cell electrode. Since the specific capacitance is proportional to the specific surface area, the supercapacitor improves energy (storage) density through the use of an activated carbon electrode, which is a porous material. An electrode is manufactured by preparing slurry including a carbon electrode material, a carbon conductive material and a polymer binder and coating the slurry on a current collector. Here, it is important to improve adhesiveness to the current collector and reduce contact resistance at the same time and further lower internal contact resistance between activated carbons by changing a ratio or kind of the binder, the conductive material and the electrode material.

When a pseudocapacitor using a metal oxide electrode material is used, the transition metal oxide exhibits higher capacity and higher power density compared to activated carbons. Recently, it has been reported that amorphous hydrate electrodes exhibit much higher specific capacitance.

Since the electric capacitance is proportional to the specific surface area, it is needed to use an electrode material having high specific surface which is the most essential factor to improve a capacitance of a supercapacitor. In addition, it is needed to have high conductivity, electrochemical inactivity, easy forming and processability and the like. Carbon materials which satisfy such properties have been widely used the most. Examples of such porous carbon materials may include activated carbon, activated carbon fiber, amorphous carbon, carbon aerogel or carbon composite, carbon nanotube and the like. However, even though such activated carbons have high specific surface area, effective pores of the activated carbon are only about 20% because most pores are micropores of which diameter is about 20 nm or less and which cannot do much for an electrode role. Since the electrode is prepared from slurry which is formed by mixing a binder, a carbon conducting material and a solvent, etc. an actual effective contact area between an electrode and an electrolyte is decreased. There are further drawbacks such as uneven electric capacitance and contact resistance between an electrode and a current collector.

KR patent application no. 2003-0099761 discloses a method for manufacturing an electrode for supercapacitors by using a metal oxide, instead of using a binder, to increase effective contact area but it still has drawbacks such as low conductivity, contact resistance and high manufacturing cost, etc.

SUMMARY

It is to provide a method for manufacturing a metal electrode for supercapacitors having a transition metal oxide coating layer on the surface and optimizing surface area in which the metal electrode is one body electrode since a current collector and a binder are not separately used, and a metal electrode manufactured thereby.

There is an aspect to provide a method for manufacturing a metal electrode having a transition metal oxide coating layer including: preparing an anode aluminum oxide template or polymer casting mold having more than two micropores; forming a metal substrate by sputtering a first metal at one side where the opening parts of the micropores of the aluminum template or the polymer casting mold are; forming more than two metal nanowire arrays by filling a second metal into the micropores of the aluminum template or the polymer casting mold by using an electroplating method; exposing the metal nanowire arrays arranged perpendicularly on the metal substrate by removing the aluminum template or the polymer casting mold; and coating the side, where the metal nanowire arrays are perpendicularly arranged on the metal substrate, and the side, where the metal nanowire arrays are exposed, with a transition metal oxide by an immersion method.

According to an embodiment, the first metal and the second metal may be identical.

According to an embodiment, the first metal and the second metal may be independently chosen from Cu, Ag, Au, Ni, Cr, Sn, Cd, Pb, Rd, Pt, Pd, In, Ru, Mn, Zn, Co and an alloy thereof.

According to an embodiment, the transition metal oxide may be chosen from $MnO_2$, $RuO_2$, CoO and NiO.

There is another aspect to provide a metal electrode having a transition metal oxide coating layer manufactured by the method described above.

There is still another aspect to provide a metal electrode including: a metal substrate composed of a first metal; more than two metal nanowire arrays arranged perpendicularly on the metal substrate and composed of a second metal; and a transition metal oxide coating layer coated on the side where the metal nanowire arrays are arranged on the metal substrate and the side where the metal nanowire arrays are exposed.

According to an embodiment, the first metal and the second metal may be identical. When they are identical, a one body metal electrode may be obtained.

According to an embodiment, the first metal and the second metal may be independently chosen from Cu, Ag, Au, Ni, Cr, Sn, Cd, Pb, Rd, Pt, Pd, In, Ru, Mn, Zn, Co and an alloy thereof.

According to an embodiment, the transition metal oxide may be chosen from $MnO_2$, $RuO_2$, CoO and NiO.

There is still another aspect to provide a supercapacitor including the metal electrode described above.

According to an embodiment, the metal electrode, manufactured by the above described method, eliminates a contact resistance problem and simultaneously improves electric conductivity of the electrode by using a one body electrode, which is not requiring separate current collector and binder, and further maintains pseudo-capacitance from the redox reaction by coating the metal surface with a transition metal oxide. In addition, the metal electrode may have superior power density, which has a high effect on supercapacitor's characteristics, to conventional ones since a metal itself is used as an electrode and thus the electric conductivity of the metal has $10^9$ times better than that of the metal oxide.

Further, the surface area of the electrode may be optimized by forming more than two metal nanowire arrays with using an anode aluminum oxide template or polymer casting mold. Here, diameters of the metal nanowire arrays may be controlled by controlling diameters of micropores of the anode aluminum oxide template or polymer casting mold. Lengthes of the metal nanowire arrays may be also controlled by controlling electrochemical parameters such as supplied current density and suppling time, etc. during the electroplating process.

DETAILED DESCRIPTION

Hereinafter, a metal electrode having a transition metal oxide coating layer according to an embodiment and a manufacturing method thereof will be described in more detail. C-A4

Figure 1:
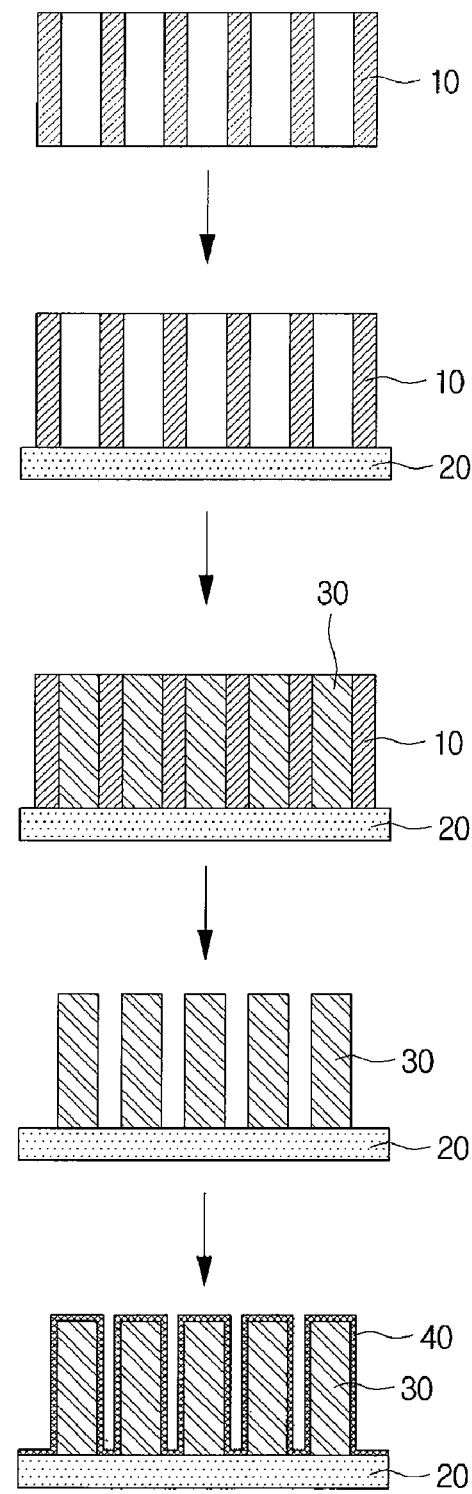
FIG. 1 illustrates a method for manufacturing a metal electrode according to an embodiment.

As illustrated in FIG. 1, a method for manufacturing a metal electrode having a transition metal oxide coating layer according to an embodiment may include (a) preparing an anode aluminum oxide template or polymer casting mold 10 having more than two micropores; (b) forming a metal substrate 20 by sputtering a first metal at one side where the opening parts of the micropores of the aluminum template or the polymer casting mold are; (c) forming more than two metal nanowire arrays 30 by filling a second metal into the micropores of the aluminum template or the polymer casting mold by using an electroplating method; (d) exposing the metal nanowire arrays arranged perpendicularly on the metal substrate by removing the aluminum template or the polymer casting mold; and (e) coating 40 the side, where the metal nanowire arrays are arranged on the metal substrate, and the side, where the metal nanowire arrays are exposed, with a transition metal oxide by an immersion method.

In step (a), the anode aluminum oxide template (AAO) or polymer casting mold, formed with more than two micropores having several tens to several hundreds nanometer of a diameter, is prepared.

Manufacturing the anode aluminum oxide template (AAO) or polymer casting mold formed with more than two micropores and controlling size of micropores may be carried by any method well-known in this field and thus detail description is omitted. The casting mold may have 20 nm to 200 nm of a diameter.

In step (b), the metal substrate may be formed by sputtering a first metal on one side where the opening parts of the micropores of the casting mold are.

The first metal may be chosen from Cu, Ag, Au, Ni, Cr, Sn, Cd, Pb, Rd, Pt, Pd, In, Ru, Mn, Zn, Co and an alloy thereof. The first metal may be formed as a metal layer to function as a substrate so that it is able to arrange more than two metal nanowire arrays perpendicularly. This metal substrate may function as a current collector at the same time by connecting the more than two metal nanowire arrays.

In step (c), the more than two metal nanowire arrays 30 may be formed by filling a second metal into the micropores of the casting mold by using an electroplating method.

The second metal may be chosen from Cu, Ag, Au, Ni, Cr, Sn, Cd, Pb, Rd, Pt, Pd, In, Ru, Mn, Zn, Co and an alloy thereof. The first and second metal may be identical. When the electroplating is carried by placing the casting mold to an electroplating solution, the second metal is filled into the micropores through the opening parts of those micropores of the casting mold and thus the metal nanowire array can be formed.

In step (d), the metal metal nanowire arrays arranged perpendicularly may be exposed on the metal substrate by removing the aluminum or polymer casting mold.

The aluminum or polymer casting mold may be removed by an etching treatment in an etching solution which is able to dissolve the casting mold.

In step (e), the transition metal oxide coating layer may be formed by coating the side where the metal nanowire arrays are arranged perpendicularly on the metal substrate and the side where the metal nanowire arrays are exposed by the immersion method.

The transition metal oxide may be chosen from $MnO_2$, $RuO_2$, CoO, NiO and the like.

A metal electrode manufactured by the method for manufacturing a metal electrode having a transition metal oxide coating layer according to an embodiment may include: a metal substrate composed of a first metal; more than two metal nanowire arrays arranged perpendicularly on the metal substrate and composed of a second metal; and a transition metal oxide coating layer coated on the side where the metal nanowire arrays are arranged on the metal substrate and the side where the metal nanowire arrays are exposed.

The metal electrode may be suitable for supercapacitors by being used as an anode, a cathode, or both electrodes. A supercapacitor according to an embodiment may optimize an effective contact area between an electrolyte and an active material to increase capacitance and improve a rate for charge/discharge process of a capacitor due to easy ion diffusion. It also eliminates a contact resistance since a current collector and an electrode is a single body.

Hereinafter, although more detailed descriptions will be given by examples, those are only for explanation and there is no intention to limit the invention.

Example

1) An anode aluminum oxide template (AAO template) having more than two micropores with 20-200 nm of a diameter was prepared.

2) A copper substrate having 1-50 μm of thickness was formed on one side where the opening parts of the micropores of the template are by using a sputtering apparatus.

3) The anode aluminum oxide template having the copper substrate formed on one side and the opening parts of the micropores on the one side was performed for the electroplating by placing into a copper electroplating solution and supplying current to fill copper into the micropores.

4) The template formed with the copper nanowire array was immersed into a 0.1 M to 5 M NaOH solution for 10 minutes to 1 hour to remove the aluminum mold and dried to expose the copper nanowire array.

Figure 2:
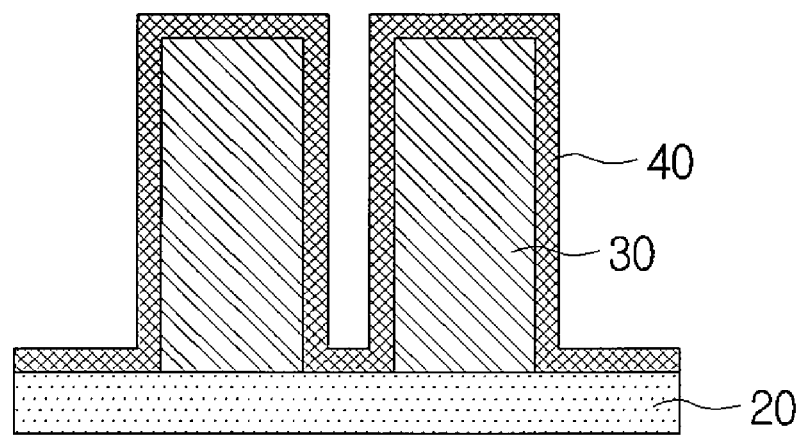
FIG. 2 is an enlarged sectional view of a part of an metal electrode manufactured by an embodiment.

5) The side, where the copper nanowire arrays arranged perpendicularly on the copper substrate were exposed, was coated with $MnO_2$ by the immersion method to form a transition metal oxide coating layer. An electrode having the transition metal oxide coating layer was manufactured as in FIG. 2.

While it has been described with reference to particular embodiments, it is to be appreciated that various changes and modifications may be made by those skilled in the art without departing from the spirit and scope of the embodiment herein, as defined by the appended claims and their equivalents.

What is claimed is:

1. A method for manufacturing a metal electrode having a transition metal oxide coating layer, the method comprising:
   preparing an anode aluminum oxide template or polymer casting mold, having more than two micropores;
   forming a metal substrate by sputtering a first metal at one side where opening parts of the micropores of the aluminum template or polymer casting mold are;
   forming more than two metal nanowire arrays by filling a second metal into the micropores of the aluminum template or polymer casting mold by using an electroplating method;
   exposing the metal nanowire arrays arranged perpendicularly on the metal substrate by removing the aluminum template or polymer casting mold; and
   coating the side where the metal nanowire arrays are arranged on the metal substrate, and the side where the metal nanowire arrays are exposed, with $MnO_2$ as a transition metal oxide by an immersion method.

2. The method of claim 1, wherein the first metal and the second metal are identical.

3. The method of claim 1, wherein the first metal and the second metal are independently selected from the group consisting of Cu, Ag, Au, Ni, Cr, Sn, Cd, Pb, Rd, Pt, Pd, In, Ru, Mn, Zn, Co and an alloy thereof.

4. The method of claim 1, wherein the anode aluminum oxide template or polymer casting mold has 20nm to 200nm of a diameter.

5. The method of claim 1, wherein the second metal is filled into the micropores through the opening parts of the micropores of the aluminum template or polymer casting mold.

* * * * *